United States Patent
Besancon et al.

(10) Patent No.: US 10,186,466 B2
(45) Date of Patent: Jan. 22, 2019

(54) ELECTRONIC DEVICE COMPRISING AN ENCAPSULATING BLOCK LOCALLY OF SMALLER THICKNESS

(71) Applicant: STMicroelectronics (Grenoble 2) SAS, Grenoble (FR)

(72) Inventors: Benoit Besancon, Villard Bonnot (FR); Luc Petit, Fontaine (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 24 days.

(21) Appl. No.: 15/728,969

(22) Filed: Oct. 10, 2017

(65) Prior Publication Data

US 2018/0033710 A1    Feb. 1, 2018

Related U.S. Application Data

(62) Division of application No. 15/240,482, filed on Aug. 18, 2016, now Pat. No. 9,818,664.

(30) Foreign Application Priority Data

Feb. 26, 2016    (FR) ...................... 16 51603

(51) Int. Cl.
*H01L 21/48*    (2006.01)
*H01L 21/52*    (2006.01)
(Continued)

(52) U.S. Cl.
CPC ........ *H01L 23/3128* (2013.01); *H01L 21/561* (2013.01); *H01L 21/565* (2013.01);
(Continued)

(58) Field of Classification Search
CPC . H01L 2924/351; H01L 21/565; H01L 24/97; H01L 24/81; H01L 23/562;
(Continued)

(56) References Cited

U.S. PATENT DOCUMENTS 7,834,470 B2 * 11/2010 Taya ...................... B29C 45/02
                                                        257/686
8,587,129 B2    11/2013 Chi et al.
(Continued)

FOREIGN PATENT DOCUMENTS

JP        2002100702 A    4/2002

OTHER PUBLICATIONS

INPI Search Report and Written Opinion for FR 1651603 dated Aug. 26, 2016 (10 pages).

*Primary Examiner* — Jasmine Clark
(74) *Attorney, Agent, or Firm* — Crowe & Dunlevy

(57) ABSTRACT

An electronic device includes a carrier substrate with at least one integrated-circuit chip mounted on a front face of the carrier substrate. An encapsulation block on the front face and embedding the integrated-circuit chip has a periphery with corners. The encapsulating block further has, in at least one local zone located in at least one corner and from the front face of the carrier substrate, a smaller thickness than a thickness of the encapsulation block at least in a surrounding zone. The electronic device is manufactured by a process in which the zone of smaller thickness is obtained by molding or by machining.

4 Claims, 4 Drawing Sheets

(51) Int. Cl.
*H01L 21/58* (2006.01)
*H01L 21/78* (2006.01)
*H01L 23/31* (2006.01)
*H01L 21/56* (2006.01)
*H01L 23/00* (2006.01)
*H01L 23/498* (2006.01)

(52) U.S. Cl.
CPC ........ *H01L 21/78* (2013.01); *H01L 23/49838* (2013.01); *H01L 23/562* (2013.01); *H01L 24/17* (2013.01); *H01L 24/81* (2013.01); *H01L 24/97* (2013.01); H01L 2224/16225 (2013.01); H01L 2224/16227 (2013.01); H01L 2224/97 (2013.01); H01L 2924/15311 (2013.01); H01L 2924/1815 (2013.01); H01L 2924/351 (2013.01)

(58) Field of Classification Search
CPC ........... H01L 2224/48091; H01L 21/78; H01L 21/67366; H01L 21/563; H01L 23/3128; H01L 2224/97
See application file for complete search history.

(56) References Cited

U.S. PATENT DOCUMENTS

| | | |
|---|---|---|
| 2010/0120199 A1 | 5/2010 | Lim et al. |
| 2012/0098115 A1 | 4/2012 | Watanabe |
| 2012/0267801 A1 | 10/2012 | Jang et al. |
| 2013/0049227 A1 | 2/2013 | Kim |
| 2015/0357251 A1 | 12/2015 | Usami |

* cited by examiner

ELECTRONIC DEVICE COMPRISING AN ENCAPSULATING BLOCK LOCALLY OF SMALLER THICKNESS

CROSS REFERENCE TO RELATED APPLICATIONS

This application is a divisional of U.S. patent application Ser. No. 15/240,482 filed Aug. 18, 2016, now U.S. Pat. No. 9,818,664, which claims priority from French Application for Patent No. 1651603 filed Feb. 26, 2016, the disclosures of which are incorporated by reference.

TECHNICAL FIELD

The present invention relates to the field of electronic devices including integrated-circuit chips.

BACKGROUND

Electronic devices comprise a carrier substrate, at least one integrated-circuit chip mounted on a front face of this carrier substrate and an encapsulating block on this front face, in which block said chip is embedded. The back face of the carrier substrate is equipped with exterior electrical connection elements intended to be coupled to printed circuit boards. These electronic devices are generally parallelepipedal in shape. In certain variant embodiments, the flanks of the encapsulating blocks are beveled.

It has been observed that because of temperature variations, these electronic devices deform differently from the printed circuit boards that receive them, generating excessive stresses in the junctions between, on the one hand, the electrical connection elements and, on the other hand, the chips and the printed circuit board. Unfortunately, sometimes such excessive stresses result in the at least partial rupture of these junctions, to the point that an electrical connection is no longer certain. This reliability problem is particularly acute in automotive applications, in which the electronic devices are subjected to many high-amplitude temperature variation cycles (between −40° C. and +125° C.).

There is a need in the art to remedy this drawback.

SUMMARY

According to one embodiment, an electronic device is provided that comprises a carrier substrate, at least one integrated-circuit chip mounted on a front face of this front carrier substrate and, on this front face, an encapsulating block in which said chip is embedded and the periphery of which has corners.

The encapsulating block has, in at least one local zone located in at least one corner and from the front face of the carrier substrate, a smaller thickness than the thickness of this block at least in the surrounding zone.

Said local zone of smaller thickness is bounded by a front void in the encapsulating block, separated from said surrounding zone by a shoulder.

Said local zone of smaller thickness may extend as far as the edge of the encapsulating block.

Said local zone of smaller thickness may extend to the exterior of the zone in which said chip is located.

The carrier substrate may be equipped with exterior electrical connection elements on a back face opposite its front face, at least certain of these electrical connection elements being placed in at least one back zone opposite, in the thickness direction of the carrier substrate, said local zone of smaller thickness.

The smaller thickness of the encapsulating block, in said local zone, may be comprised between ten and fifty percent of the thickness of the encapsulating block in the surrounding zone.

Provision is also made for a process for simultaneously manufacturing electronic devices, wherein chips are mounted on adjacent locations of a front face of a carrier substrate.

This process may comprise: placing the carrier substrate equipped with the chips in a cavity of a mold, the mold comprising portions protruding in the direction of the carrier substrate from a face of said cavity located facing said front face of said carrier substrate, these protruding portions extending over front zones located facing and away from adjacent corners of said locations; injecting an encapsulating material into the space of the cavity between the carrier substrate and said face of the cavity in order to produce a common encapsulating block; and dicing the carrier substrate and the common encapsulating block along common sides of said locations.

The distance between said protruding portions and said front face of the carrier substrate may be comprised between ten and fifty percent of the distance between said face of the cavity and said front face of the carrier substrate.

Provision is also made for a process for simultaneously manufacturing electronic devices, wherein chips are mounted on adjacent locations of a front face of a carrier substrate and a common encapsulating block on this front face, in which block the chips are embedded.

This process comprises: machining voids in front zones of the common encapsulating block covering adjacent corners of said locations, in such a way as to leave behind a smaller thickness of the common encapsulating block; and dicing the carrier substrate and the common encapsulating block along common sides of said locations.

The smaller thickness of the common encapsulating block, in the zones of said voids, may be comprised between ten and fifty percent of the thickness of this block in the surrounding zones.

BRIEF DESCRIPTION OF THE DRAWINGS

An electronic device will now be described by way of exemplary embodiment, illustrated by the appended drawings in which.

DETAILED DESCRIPTION

Figure 1:
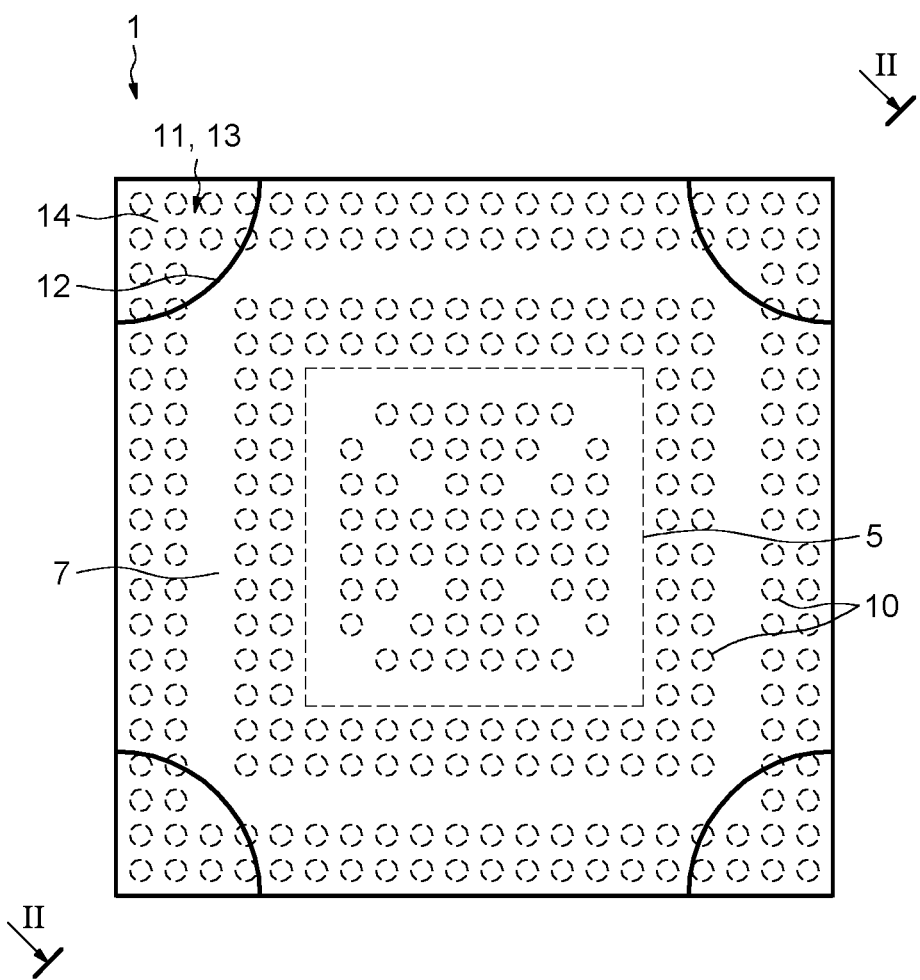
FIG. 1 shows a top view of an electronic device.
Figure 2:
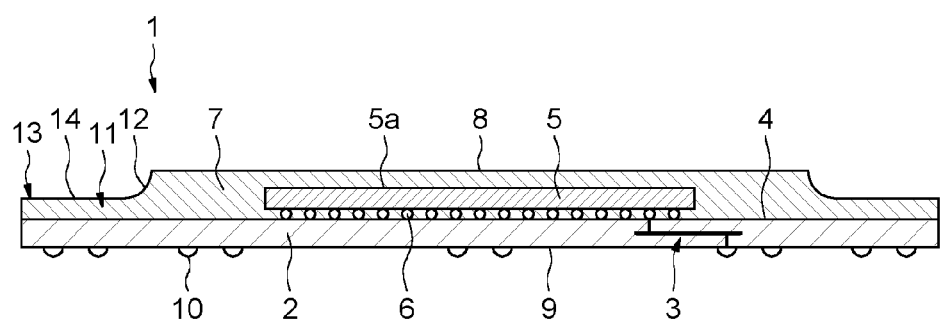
FIG. 2 shows a cross section of the electronic device in FIG. 1, along a diagonal.
Figure 3:
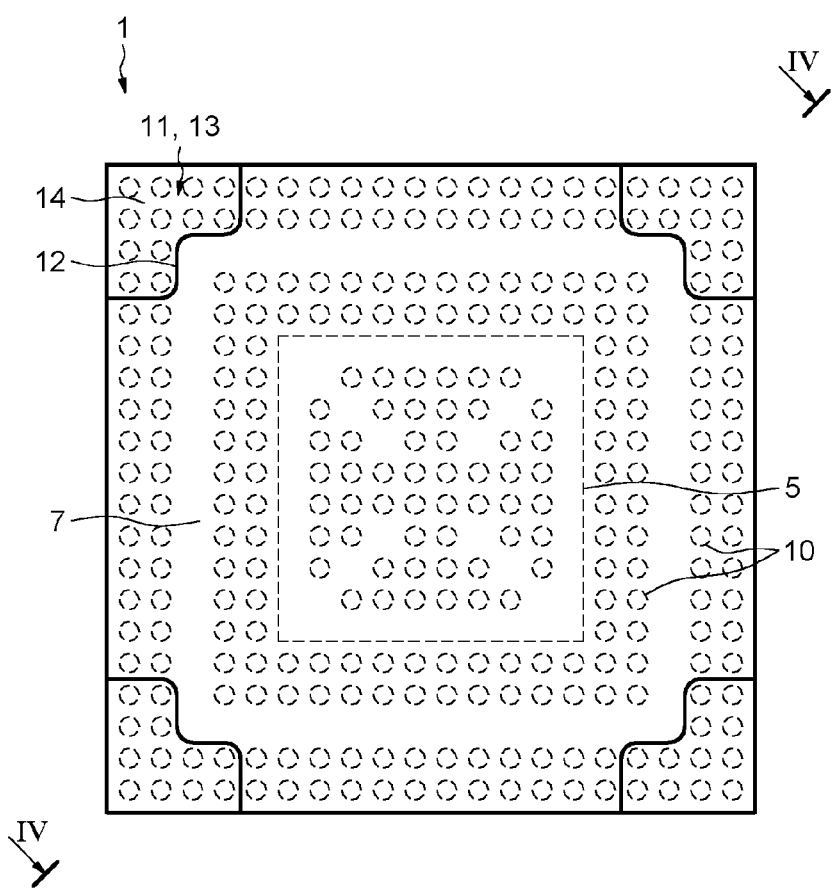
FIG. 3 shows a top view of a variant embodiment of the electronic device.

FIGS. 1 to 3 illustrate an electronic device 1 that comprises a carrier substrate 2 that is provided with an integrated electrical connection network 3 and that has a front face 4 on which an integrated-circuit chip 5 is mounted by way of electrical connection elements 6 that are soldered to pads, electrically connecting the chip 5 to the electrical connection network 3. The periphery of the chip 5 is inside and away from the periphery of the carrier substrate 2.

The electronic device 1 furthermore comprises an encapsulating block 7, for example made of epoxy resin, formed on the front face 4 of the carrier substrate 2, in which block the chip 5 is embedded. The encapsulating block 7 has a front face 8 parallel to the front face 4 of the carrier substrate 2 and extends over the front face 5a of the chip 5. In one variant embodiment, the encapsulating block 7 could be flush with the front face of the chip 5.

In one variant embodiment, the chip 5 could be adhesively bonded to the front face 4 of the carrier substrate 2. In this case, the electrical connection wires would connect front pads of the chip 5 and pads of the front face 4, which pads would be placed around and a small distance away from the chip 5 and connected to the electrical connection network 3, these electrical connection wires being embedded in the encapsulating block 7.

The carrier substrate 2 and the chip 5 have square or rectangular outlines and their sides are parallel. In one variant embodiment, the sides of the chip 5 could be inclined relative to the sides of the carrier substrate 2. The outline of the encapsulating block 7 follows the outline of the carrier substrate 2 and is at right angles to the front face 4 of the carrier substrate 2, and hence the electronic device 1 is the shape of a rectangular parallelepiped and the periphery of the encapsulating block has four corners. Each corner is defined as being a portion of the encapsulating block 7 that is comprised between two edges of this block, which edges intersect or meet at an apex, and that is adjacent to this apex.

On the back face 9 opposite its front face 8, the carrier substrate 2 is equipped with a plurality of soldered back exterior electrical connection elements 10, such as metal bumps, that are connected to the electrical connection network 3 of the carrier substrate 2.

Such a device 1 is commonly designated a BGA (for Ball Grid Array) packaged chip. For example, the electrical connection elements 10 are provided in two rows in the peripheral zone of the back face 9, which rows are parallel to the sides of the outline of the carrier substrate, in two rows in the median zone of the back face 9, which rows are also parallel to the sides of the outline of the carrier substrate, and in the central zone of the back face 9.

The encapsulating block 7 has, in the local zones 11 located in its four corners and from the front face 4 of the carrier substrate 2, smaller thicknesses than the thickness of this block 7 at least in the surrounding zone, i.e., in the present case, its thickness determined between the front face 4 of the carrier substrate 2 and the back face 8 of the encapsulating block. Thus, in correspondence with these local zones 11, the electronic device 1 has smaller thicknesses.

Advantageously, the smaller thickness of the encapsulating block 7, in the local zones 11, may be comprised between ten and fifty percent of the thickness of the encapsulating block 7 in the surrounding zones, generally of the total thickness of the encapsulating block 7 between the front face of the carrier substrate 2 and the front face of the encapsulating block. In particular, in the case where the total thickness of the encapsulating block 7 is equal to eight tenths of a millimeter, the thickness of the local zones 11 may be equal to two tenths of a millimeter.

The local zones 11 of smaller thicknesses define, with the surrounding zones, shoulders 12 that reach the sides of the carrier substrate 2 at points located away from the apexes of the corners, so that, in these zones of smaller thicknesses, the encapsulating block 7 comprises front voids 13 that open laterally and that are bordered internally by the shoulders 12. For example, the local zones 11 of smaller thicknesses have flat front faces 14 parallel to the front face 4 of the carrier substrate 1.

According to the example shown in FIG. 1, the shoulders 12 are quarter circles centered on the apexes of the corners and are located outside the zone covered by the chip 5.

According to the example shown in FIG. 3, the shoulders 12 are the shape of a W the central tips of which are oriented on the side of the apexes of the corners and the arms of which are at right angles and perpendicular or parallel to the adjacent sides of the encapsulating block 7.

The shoulders 12 may be shapes other than those illustrated in FIGS. 1 and 3, for example shapes with two arms making an angle, for example an obtuse or right angle open on the side of the corresponding apex.

According to one variant embodiment, the front faces 14 of the local zones 11 of smaller thicknesses could be stepped.

Certain of the back connection elements 10 of said rows in the peripheral zone of the back face 9, which are specifically located in the corners, are placed in back zones that are opposite, in the thickness direction of the carrier substrate 2, the local zones 11 of smaller thicknesses of the encapsulating block 7.

By virtue of the existence of the local zones 11 of smaller thicknesses of the encapsulating block 7, the electronic device 1 has, in its corners, a lower flexural strength.

Thus, since the electronic device 1 is mounted on a printed circuit board (not shown) the corners of smaller thicknesses of the electronic device 1 are able to deform in order to withstand, in particular flexurally, differential dimensional variations between the electronic device 1 and the printed circuit board, without occurring damage or detachment of bonds between the exterior electrical connection elements 10 and the chip 5 and/or the printed circuit board.

Figure 4:
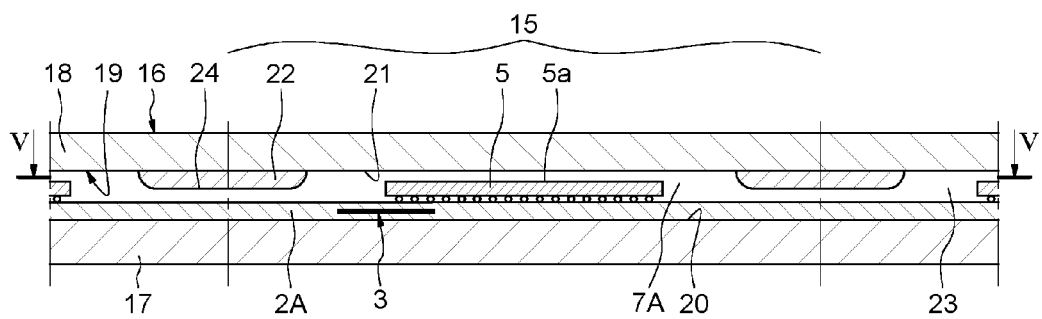
FIG. 4 shows a cross section, along IV-IV in FIG. 5, of one method for simultaneously manufacturing electronic devices.
Figure 5:
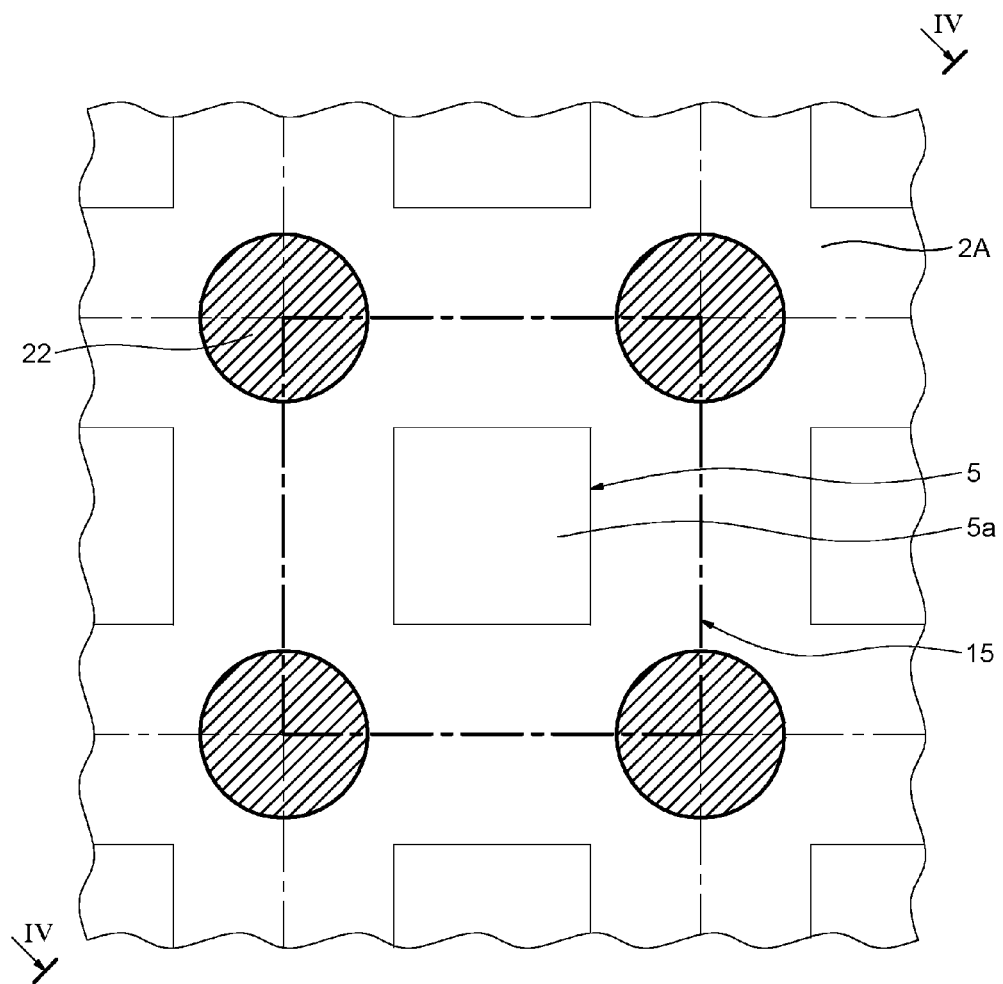
FIG. 5 shows a flat section along V-V of the manufacturing method in FIG. 4.

With reference to FIGS. 4 and 5, a method for simultaneously manufacturing electronic devices 1 will now be described.

A carrier substrate 2A is provided that, in adjacent locations 15 corresponding to the carrier substrates 2 of the electric devices 1 to be obtained, is provided with integrated electrical connection networks 3 and bears chips 5 on a front face.

A mold 16 is provided comprising two opposite portions 17 and 18 between which a cavity 19 is housed, having parallel opposite faces 20 and 21 of these portions. The distance between these parallel opposite faces 20 and 21 of the cavity 19 is equal to the thickness, between the back face 9 of the carrier substrate 2 and the front face 8 of the encapsulating block 7, of the electronic devices to be obtained.

The portion 18 of the mold 16 comprises collective inserts 22 protruding into the cavity 19 relative to the face 21, in the direction of the face 20. The inserts 22 are centered on the corners of the locations 15 and have shapes corresponding, circumferentially, to four times the shapes of the corner voids 13 to be obtained. The distance between the faces of the inserts 22 and the face 20 of the cavity is equal to the sum of the thickness of the carrier substrate 2 and of the thickness of the local zones 11 of smaller thicknesses of the electronic devices to be obtained The inserts 22 may be added to the portion 18 of the mold 16 or may be an integral portion of this portion 18.

As illustrated in FIG. 5, the inserts 22 have circular sections with a view to obtaining the voids 13 with quarter-circle shoulders in FIG. 1.

Figure 6:
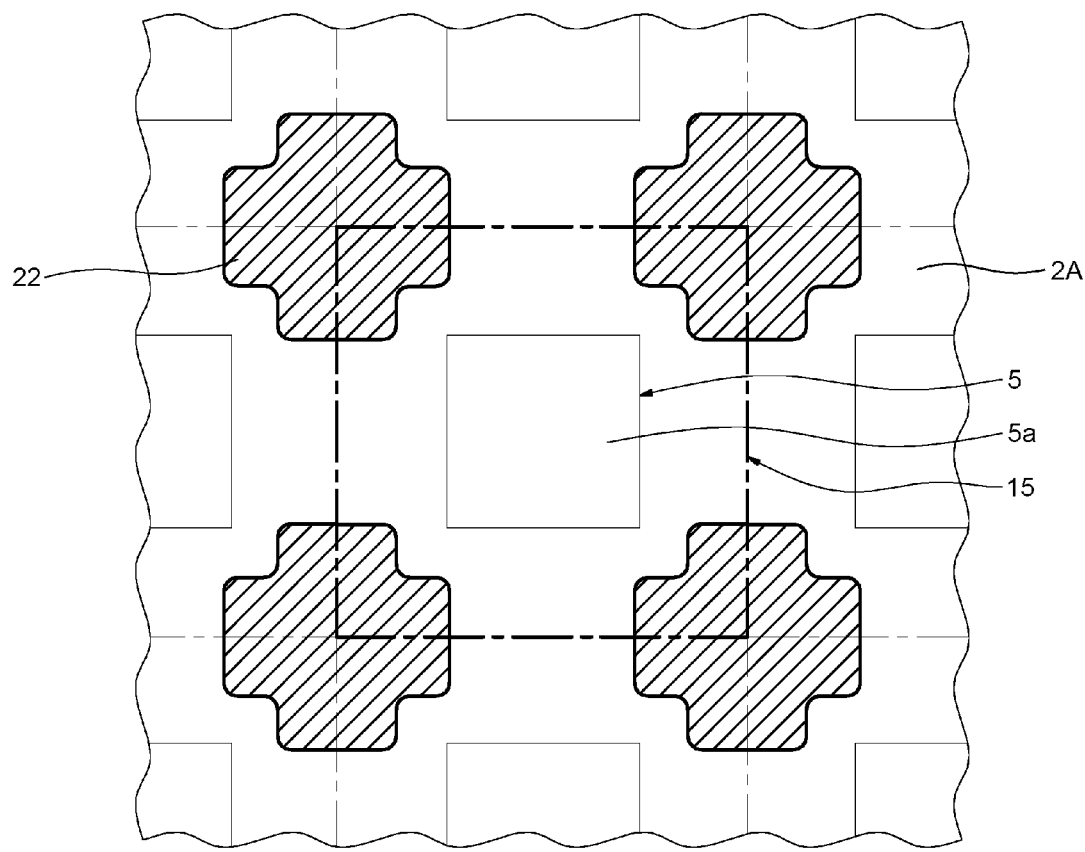
FIG. 6 shows a flat section along V-V of a variant embodiment of the manufacturing method in FIG. 4.

As illustrated in FIG. 6, the inserts 22 have star-shaped sections with a view to obtaining the voids 13 with W-shaped shoulders in FIG. 3.

The carrier substrate 2A is placed in the cavity 19, the back face of the carrier substrate 2A being on the face 20 of the cavity 19 and the face 21 of the cavity 19 lying at a distance away from and above the front faces 5a of the chips 5, the chips 5 being at the center of the locations 15.

A space 23 corresponding, in the locations 15, to the encapsulating blocks 7 of the electronic devices 1 to be obtained is thus left free. The distance between the protruding inserts 22 and the front face equipped with chips 5 of the carrier substrate 2A may be comprised between ten and fifty percent of the distance between the face 21 of the cavity 19 and the front face of the carrier substrate 2A.

An encapsulating material is injected into this space 23 in order to obtain a common encapsulating block 7A having collective voids 24 formed by the inserts 22. Since the inserts 22 are placed only in the corners of the adjacent locations 15 corresponding to the carrier substrates 2 of the electronic devices 1 to be obtained, the encapsulating material may flow between the various locations 15. It is therefore possible to simultaneously encapsulate a plurality of chips 5, in a single manufacturing step, this decreasing the manufacturing cost of the electronic devices 1.

After demolding, dicing is carried out, for example by sawing, along rows and columns of the matrix of locations 15, perpendicularly to the carrier substrate 2A, through the carrier substrate 2A and the common encapsulating block, the collective voids 24, resulting from the inserts 22, then being divided into four.

Thus, a plurality of electric devices 1 corresponding to the various locations 15 is obtained.

Figure 7:
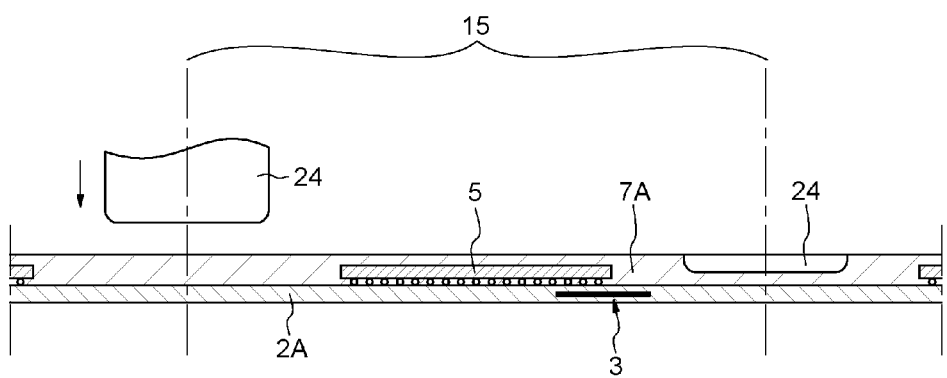
FIG. 7 shows a section along a diagonal of another simultaneous manufacturing method.

According to another embodiment illustrated in FIG. 7, a common encapsulating block 7A having a flat front face is produced, as described above, by molding on a carrier substrate 2A equipped with chips 5.

Next, using a rotary cutting tool 25, circular collective voids 24 are produced in the zones of the corners of the locations 15, which leave behind smaller thicknesses of common encapsulating block 7A. The smaller thickness of the common encapsulating block 7A, in the zones of the voids 24, may be comprised between ten and fifty percent of the thickness of this block in the surrounding zones, i.e. the total thickness of the common encapsulating block 7A.

Next, dicing is carried out as described above.

According to one variant embodiment, the outline of the encapsulating block 7 of the electronic device 1 could be located inside and away from the outline of the carrier substrate 2.

According to one variant embodiment, the zones 11 of smaller thicknesses could have stepped front faces.

The invention claimed is:

1. A process, comprising:
    mounting integrated-circuit chips on adjacent locations of a front face of a carrier substrate;
    placing the carrier substrate equipped with the integrated-circuit chips in a cavity of a mold, wherein the mold comprises portions protruding in a direction of the carrier substrate from a face of said cavity located facing said front face of said carrier substrate, the protruding portions extending over front zones located facing and away from adjacent corners of said adjacent locations;
    injecting an encapsulating material into a space of the cavity between the carrier substrate and said face of the cavity in order to produce a common encapsulating block; and
    dicing the carrier substrate and the common encapsulating block along common sides of said adjacent locations.

2. The process according to claim 1, wherein a distance between said protruding portions and said front face of the carrier substrate is comprised between ten and fifty percent of a distance between said face of the cavity and said front face of the carrier substrate.

3. A process for simultaneously manufacturing electronic devices, comprising:
    mounting integrated-circuit chips on adjacent locations of a front face of a carrier substrate;
    placing the carrier substrate equipped with the integrated-circuit chips in a cavity of a mold;
    injecting an encapsulating material into a space of the cavity between the carrier substrate and a face of the cavity in order to produce a common encapsulating block;
    machining voids in front zones of the common encapsulating block covering adjacent corners of said adjacent locations in such a way as to leave behind a smaller thickness of the common encapsulating block; and
    dicing the carrier substrate and the common encapsulating block along common sides of said adjacent locations.

4. The process according to claim 3, wherein the smaller thickness of the common encapsulating block, in the zones of said voids, is comprised between ten and fifty percent of the thickness of this block in the surrounding zones.

* * * * *